United States Patent
Galy et al.

(10) Patent No.: US 9,230,950 B2
(45) Date of Patent: Jan. 5, 2016

(54) METHOD FOR PRODUCING AN ELECTRONIC DEVICE BY ASSEMBLING SEMI-CONDUCTING BLOCKS AND CORRESPONDING DEVICE

(71) Applicant: STMICROELECTRONICS SA, Montrouge (FR)

(72) Inventors: Philippe Galy, Le Touvet (FR); Jean Jimenez, Saint Théoffrey (FR)

(73) Assignee: STMICROELECTRONICS SA, Montrouge (FR)

( * ) Notice: Subject to any disclaimer, the term of this patent is extended or adjusted under 35 U.S.C. 154(b) by 0 days.

(21) Appl. No.: 13/859,418

(22) Filed: Apr. 9, 2013

(65) Prior Publication Data

US 2013/0264677 A1    Oct. 10, 2013

(30) Foreign Application Priority Data

Apr. 10, 2012    (FR) .................................... 12 53249

(51) Int. Cl.
| | |
|---|---|
| *H01L 27/02* | (2006.01) |
| *H01L 21/77* | (2006.01) |
| *H01L 27/12* | (2006.01) |
| H01L 21/762 | (2006.01) |
| H01L 27/088 | (2006.01) |
| H01L 29/78 | (2006.01) |
| H01L 29/06 | (2006.01) |
| H01L 29/43 | (2006.01) |

(52) U.S. Cl.
CPC ............ *H01L 27/0207* (2013.01); *H01L 21/77* (2013.01); *H01L 27/1211* (2013.01); *H01L 21/76264* (2013.01); *H01L 27/088* (2013.01); *H01L 29/0692* (2013.01); *H01L 29/435* (2013.01); *H01L 29/78* (2013.01); *H01L 29/7824* (2013.01); *H01L 29/7825* (2013.01)

(58) Field of Classification Search
CPC . H01L 21/0207; H01L 27/77; H01L 27/0207; H01L 27/1211
USPC ......... 257/510, 75, 424; 326/104; 377/64, 69; 365/200, 225.7; 438/129
See application file for complete search history.

(56) References Cited

U.S. PATENT DOCUMENTS

| | | | | |
|---|---|---|---|---|
| 4,296,428 | A * | 10/1981 | Haraszti ........................ | 257/331 |
| 5,828,101 | A * | 10/1998 | Endo .............................. | 257/330 |
| 6,518,112 | B2 * | 2/2003 | Armacost et al. ............. | 438/212 |
| 8,561,003 | B2 * | 10/2013 | Kawa et al. ................... | 716/132 |
| 2007/0008013 | A1 | 1/2007 | Fijany et al. | |
| 2010/0270619 | A1 * | 10/2010 | Lee ............................... | 257/365 |

FOREIGN PATENT DOCUMENTS

| | | |
|---|---|---|
| WO | 2007133775 | 11/2007 |
| WO | 2009116015 | 9/2009 |

\* cited by examiner

*Primary Examiner* — Eduardo A Rodela
*Assistant Examiner* — Vincent Wall
(74) *Attorney, Agent, or Firm* — Allen, Dyer, Doppelt, Milbrath & Gilchrist, P.A.

(57) ABSTRACT

At least three electrically conducting blocks are disposed within an isolating region; and at least two of them are mutually separated and capacitively coupled by a part of the isolating region. At least two of them, being semiconductor, have opposite types of conductivity or identical types of conductivity, but with different concentrations of dopants, and these are in mutual contact by one of their sides. The mutual arrangement of these blocks within the isolating region, their type of conductivity and their concentration of dopants form at least one electronic module. Some of the blocks define input and output blocks.

13 Claims, 15 Drawing Sheets

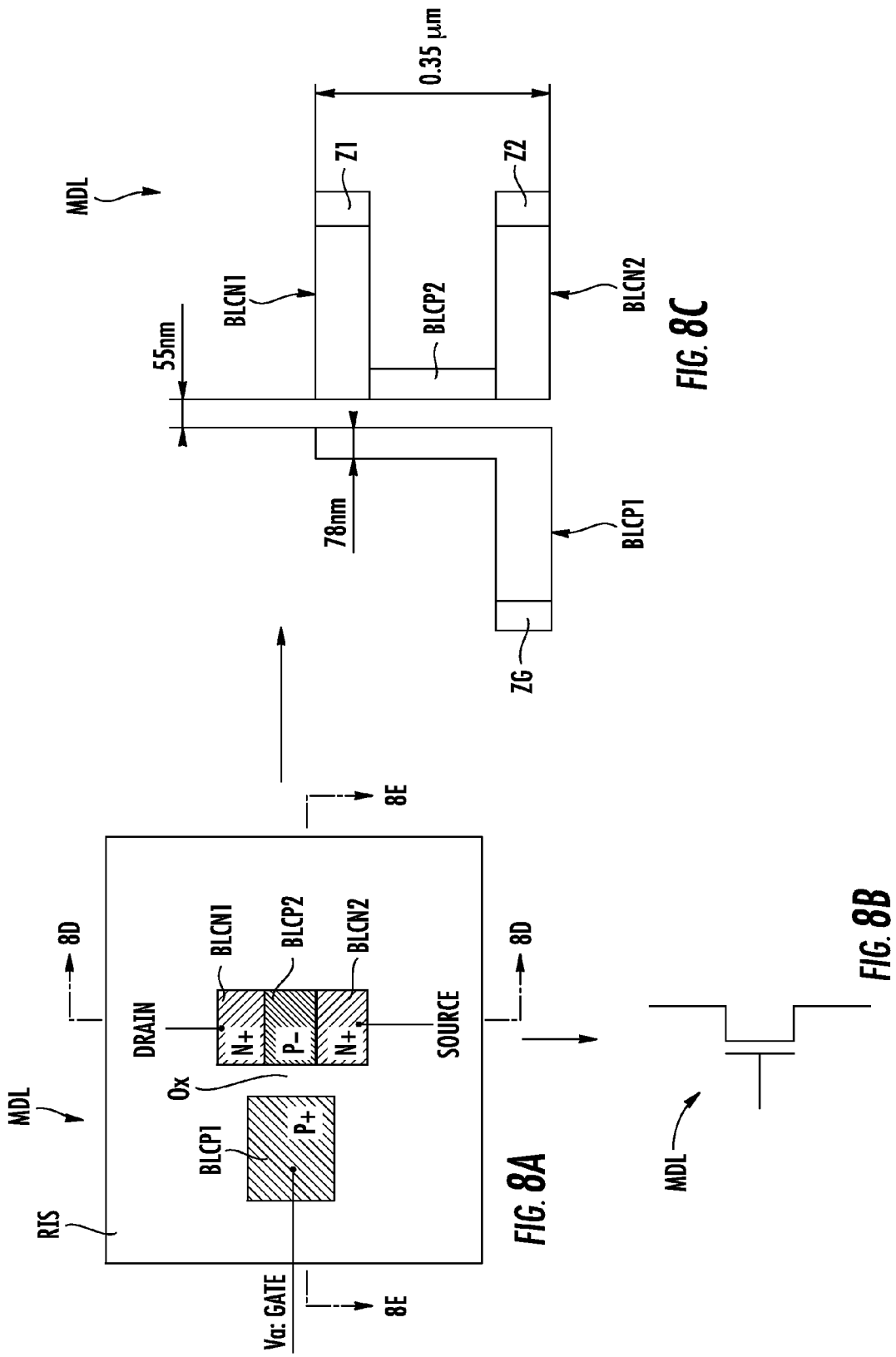

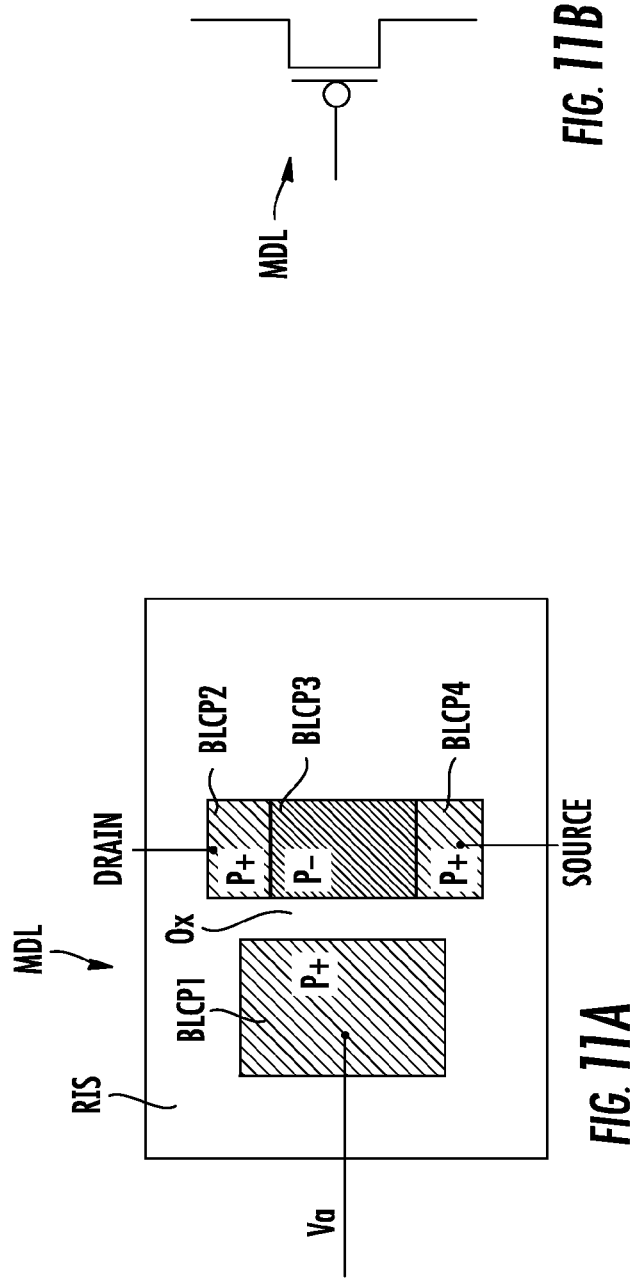

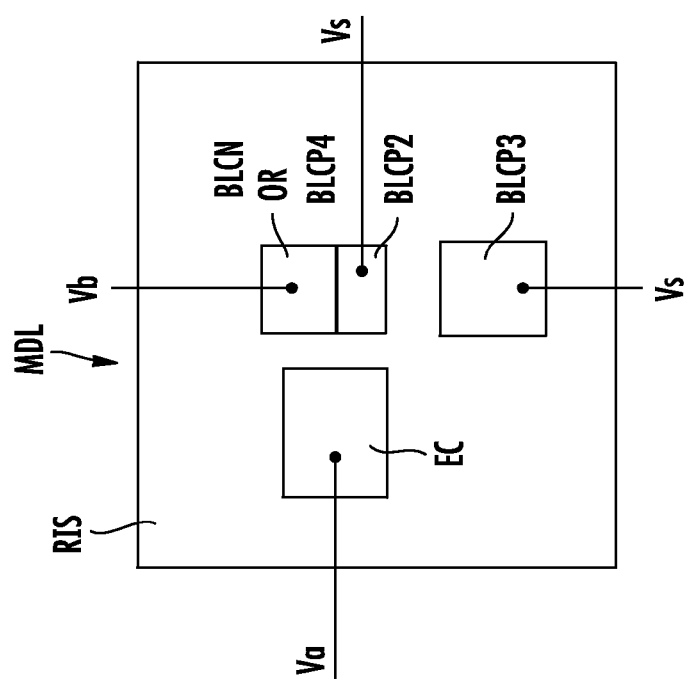
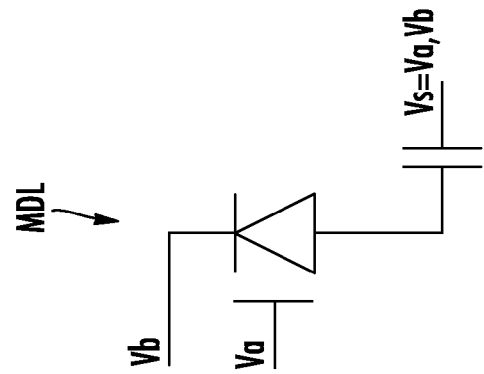
FIG. 16A
FIG. 16B

METHOD FOR PRODUCING AN ELECTRONIC DEVICE BY ASSEMBLING SEMI-CONDUCTING BLOCKS AND CORRESPONDING DEVICE

FIELD OF THE INVENTION

The invention relates to microelectronics, and more particularly, to the processing of electronic information, such as electrical signals (current and/or voltage) using a mutual arrangement of electrically conducting, for example, semiconducting, blocks, particularly active-zone blocks.

BACKGROUND OF THE INVENTION

Transistors are widely used in electronic devices. A typical transistor includes spaced apart source and drain regions with a channel extending therebetween. A gate structure, including a gate dielectric and gate conductor, is typically formed over the channel. A conventional structure of such a transistor may include a sometimes complex stack of semiconducting and/or metallic zones.

Such conventional transistor are also commonly arranged to define logic circuits, such as for Boolean operations, that may also be relatively complicated to form.

SUMMARY OF THE INVENTION

According to one mode of implementation and embodiment, it is proposed to produce an electronic device by using "elementary bricks" formed of electrically conducting blocks, for example, semiconducting and/or metallic blocks, mutually arranged to form one or more electronic modules, such as, for example, one or more MOS transistors. The arrangement of the blocks forming the module depend on the electronic function desired for the module. It is possible to form in an extremely flexible manner any electronic device carrying out an electronic function, and particularly transistors, while avoiding the conventional structure of a transistor using a sometimes complex stack of semiconducting and/or metallic zones.

It may also become possible to produce logic circuits, for example, Boolean operators, in an extremely simple manner without using conventional transistor structures.

According to one aspect, there is proposed an electronic device production method comprising a formation within an isolating region of at least three electrically conducting blocks. At least two blocks, for example semiconducting and/or metallic, are mutually separated and in mutual capacitive coupling by way of a part of the isolating region and at least two semiconducting blocks exhibiting opposite types of conductivity or identical types of conductivity, but with different concentrations of dopants, are in mutual contact by one of their sides. The choice of the number of blocks, of their type of conductivity, of their concentration of dopants and their mutual arrangement make it possible to form at least one electronic module having at least one desired electronic function.

The method also comprises a selection of at least two blocks from among those forming the at least one electronic module intended to have electrical signals be applied, a selection of at least one block from among those forming the at least one electronic module intended to deliver an electrical signal in response to the signals applied. The selection of these blocks depending on the at least one electronic function of the at least one electronic module.

Thus, according to one mode of implementation, the electronic function of the module thus produced is obtained solely by capacitive coupling between certain electrically conducting blocks, for example, semiconducting and/or metallic blocks, and by contact between other semiconducting blocks.

It then becomes possible to form, for example, the blocks of at least one module, for example a MOS transistor, and optionally the blocks of several modules or indeed of all the modules, in one and the same plane or same level, so as to produce a module, or indeed a part or the entirety of a device, having an essentially two-dimensional structure. This is therefore distinguished from the conventional structure of a MOS transistor comprising an insulated gate above the source, drain and channel active zones.

Blocks extending in one and the same plane (horizontal, vertical or oblique) or coplanar blocks, are understood in particular as being blocks all possessing at least one face, the at least one face of all these blocks being all coplanar. That is to say all extending in one and the same plane. These coplanar faces may be, for example, the upper faces of the blocks and the heights of the blocks may be identical (in this case the lower faces of the blocks are also coplanar) or different.

It is also possible to form blocks of a first module in a first plane and the blocks of a second module in a second plane different from the first so as to produce a device of three-dimensional structure. Thus, for example, it is possible to stack levels of blocks to produce a plurality of electronic modules in an extremely simple manner.

When several electronic modules are formed, it is possible, according to one mode of implementation, to produce an electrical coupling between the electronic modules by way of at least one of their respective blocks, for example, by using metallizations or metal lines. These may be customarily used in the interconnections (Back End Of Lines: BEOL according to a term well known to the person skilled in the art) of an integrated circuit, or else, for example, by electrically conducting trenches may also be used, for example, those filled with metal, which may or may not be coplanar with the blocks.

So as to favor an electrically conducting contact tap on at least some of the selected blocks, such as semiconducting blocks, and having to receive or deliver electrical signals, it may be particularly advantageous to carry out on these blocks a post treatment, for example a silicidation, especially if these blocks are made of silicon.

Any semiconducting material is suitable for the production of at least some of the blocks of an electronic device such as described herein. It is for example possible to use a conventional semiconducting material such as silicon, polysilicon or Group III-V materials. That said, it would also be possible to use carbon.

Likewise, any insulating material forming the isolating region is suitable. It is possible to use insulating or dielectric materials such as silicon dioxide, but also a material such as glass, or else a flexible or rigid, polymer and/or organic insulating material.

According to one embodiment, at least some of the blocks are formed within an isolating region made in a semiconductor substrate, such as an integrated circuit conventional substrate.

The blocks may be formed of a semiconductor material of monocrystalline or polycrystalline structure, for example, silicon or polysilicon and, for example, of the same material as that of the semiconductor substrate in which the isolating region is produced.

It is then possible to form at least one part of the isolating region with trenches containing a field oxide. This field oxide, typically silicon dioxide, is for example analogous to that formed in shallow isolation trenches, known by the person skilled in the art by the name STI: Shallow Trench Isolation.

Thus, when producing a MOS transistor, the block forming the gate of the transistor, which is in capacitive coupling with the block forming the channel region, is separated from this channel region by a field oxide and not by a conventional gate oxide. This simplifies production and furthermore makes it possible to modulate the threshold voltage of the transistor by simply altering the distance separating the block forming the gate of the MOS transistor and the block forming the channel region. This is not possible at present since for a given technology, since the gate oxide of a transistor has a determined and fixed thickness.

Although it is possible to use a bulk substrate as semiconductor substrate, it is particularly advantageous to use an SOI substrate (SOI: Silicon On Insulator according to a term well known to the person skilled in the art). In this case, at least one part of the isolating region is made within the upper semiconductor layer of the substrate of SOI type. The buried insulating layer of the substrate can then advantageously be used to form another part of the isolating region, typically the lower part.

According to another aspect, there is proposed an electronic device, comprising at least three electrically conducting blocks disposed within an isolating region; at least two of them, for example, semiconductor and/or metallic, are mutually separated and capacitively coupled by way of a part of the isolating region and at least two of them are semiconductor and exhibit opposite types of conductivity or identical types of conductivity but with different concentrations of dopants and are in mutual contact by one of their sides. The mutual arrangement of these blocks within the isolating region, their type of conductivity and their concentration of dopants forming at least one electronic module having at least one desired electronic function. At least two blocks from among those forming the at least one module are intended to have electrical signals be applied, and at least one block from among those forming the at least one module are intended to deliver an electrical signal in response to these signals applied having regard to the at least one electronic function. According to one embodiment, the blocks intended to have electrical signals be applied and the block or blocks intended to deliver one or more electrical signals comprise electrical contact tap zones.

According to one embodiment, the device comprises several electronic modules electrically coupled by way of at least one of their respective blocks.

At least some of the blocks may be situated within an isolating region made in a semiconductor substrate, the blocks possibly being formed of a semiconductor material of monocrystalline or polycrystalline structure and at least one part of the isolating region can comprise trenches containing a field oxide.

The semiconductor substrate used may be a substrate of the SOI type.

According to one embodiment, the blocks of at least one module extend in one and the same plane so as to produce a module of essentially two-dimensional structure.

It is also possible for the blocks of each module to extend in one and the same plane. As a variant, the blocks of at least one first module extend in a first plane and the blocks of at least one second module extend in a second plane different from the first so as to produce a device of three-dimensional structure.

At least one electronic module can comprise at least one of a transistor, a logic circuit, a resistor of controllable resistive value, a controllable PN junction, an inverter, and a memory cell. For all these elements, the blocks forming the element may be coplanar.

According to one embodiment, the element comprises at least one first block in capacitive coupling with at least one other block by way of a part of the isolating region, the at least one first block forming a control electrode for the element.

BRIEF DESCRIPTION OF THE DRAWINGS

Other advantages and characteristics of the invention will be apparent on examining the detailed description of wholly non-limiting modes of implementation and embodiments, and the appended drawings in which:

FIG. 8A is a schematic plan view of an NMOS transistor according to the invention.

FIG. 8B is a schematic circuit diagram of the NMOS transistor of FIG. 8A.

FIG. 8C is a schematic plan view of another embodiment of the NMOS transistor of FIG. 8A.

FIG. 11A is a schematic plan view of a PMOS transistor according to the invention.

FIG. 11B is a schematic circuit diagram of the PMOS transistor of FIG. 11A.

FIG. 16A is a schematic plan view of a module according to the invention.

FIG. 16B is a schematic circuit diagram of the module of FIG. 16A.

DETAILED DESCRIPTION OF THE PREFERRED EMBODIMENTS

Figure 1:
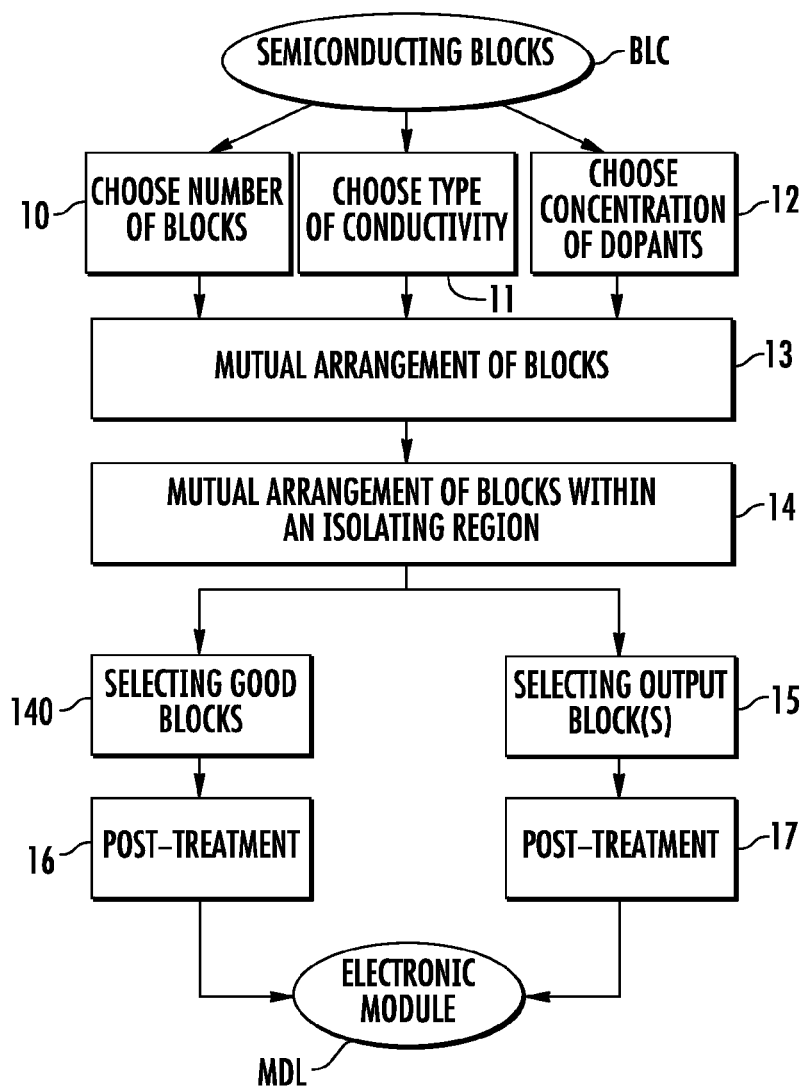
FIG. 1 is a flowchart representing a method according to the invention.

In FIG. 1, it is seen that an electronic module MDL of an electronic device is produced by a mutual arrangement 13 and a formation 14, within an isolating region, of blocks BLC, for example, all semiconductor. More precisely, the number of semiconductor blocks BLC, their conductivity type and their dopant concentration are chosen (steps 10, 11, 12) as a function of the structure and of the electronic function of the electronic module MDL that it is desired to be formed, as is their mutual arrangement (step 13).

At least two blocks from among those forming the electronic module are selected (step 140) so as to form input blocks intended to have electrical signals applied thereto. At least one output block intended to deliver an electrical signal in response to the signals applied is also selected (step 15). The selection of these blocks also depends on the electronic function of the electronic module MDL. The method also includes a post treatment (steps 16, 17) on at least one selected block.

And, although not indispensable, it may however be desirable to perform a post-treatment on the selected input and output blocks so as to favor an electrical contact tap on these blocks, in particular, in the case of a contact tap in the plane or perpendicular to the latter. Such a post-treatment may be for example a conventional silicidation treatment.

In fact, as seen in FIG. 1, the production of the electronic module and optionally of several electronic modules forming the device, is obtained on the basis of a mutual arrangement of elementary bricks which are semiconductor blocks made within an isolating region. Certain of these semiconductor blocks may be in capacitive coupling and/or certain others may be in contact by one of their sides. That said, the blocks in capacitive coupling and not in contact could be metallic.

An electronic module may be a component such as a transistor, a resistor of controllable or fixed resistive value, a capacitor, a controllable PN junction, or else a logic circuit, for example, implementing a Boolean operator (OR, AND, EXCLUSIVE OR etc. logic function) or an inverter, or a memory cell, without this list being exhaustive.

Figure 2:
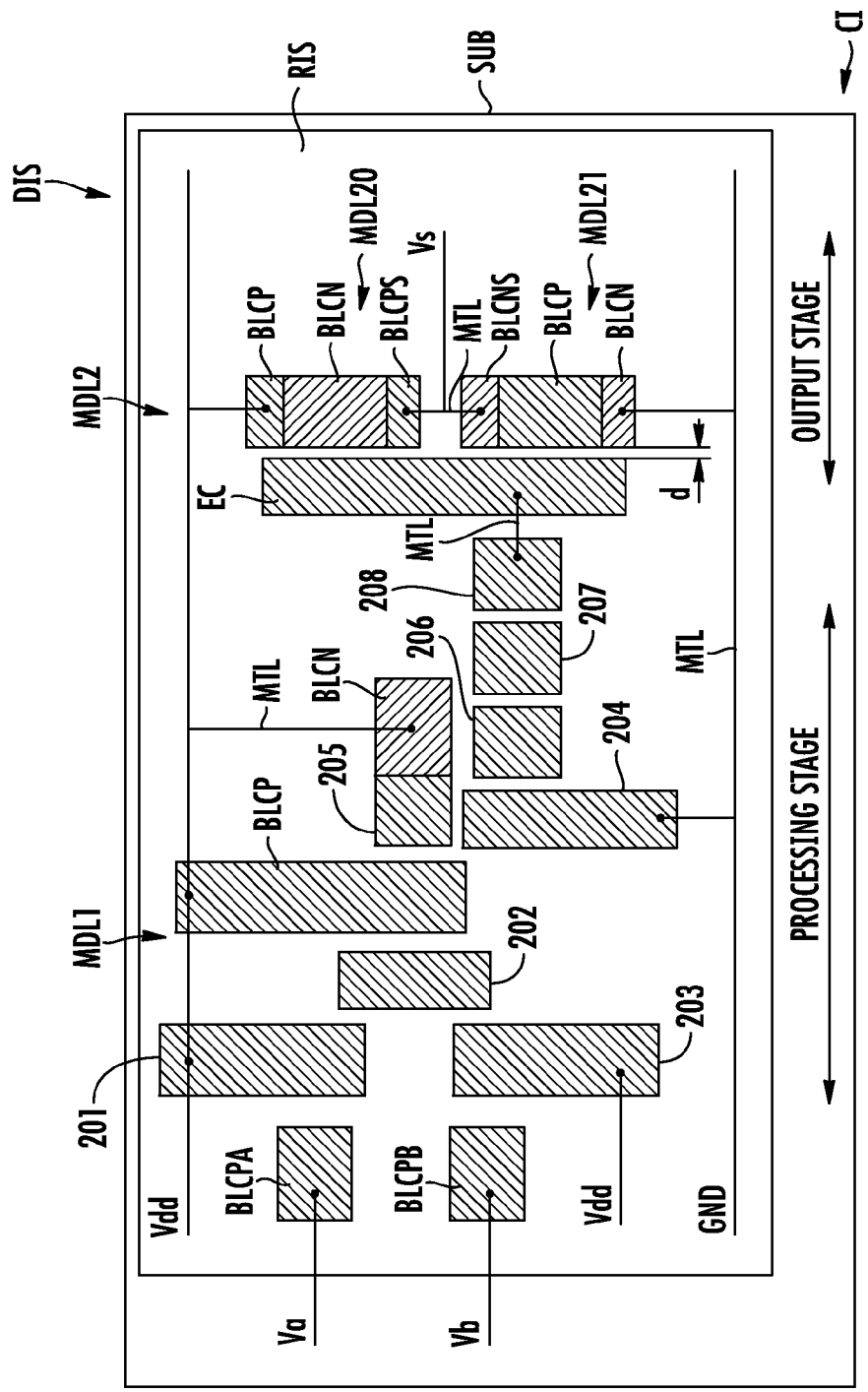
FIG. 2 is a schematic plan view of an electronic device according to the invention.

FIG. 2 schematically illustrates an exemplary device DIS. The device DIS here comprises an isolating region RIS made, for example, within a semiconductor substrate SUB of an integrated circuit CI and includes blocks 201-208.

The device DIS comprises several semiconductor blocks which may be of conductivity type N or of conductivity type P with different concentrations of dopants. The blocks of the device are in this example situated in one and the same plane, that is to say they each exhibit at least one face, for example their upper face, all these faces being coplanar.

In FIG. 2, the blocks referenced BLCP exhibit a conductivity type P while the blocks referenced BLCN exhibit a conductivity type N. It is seen in FIG. 2 that certain blocks which have different types of conductivity are in mutual contact by one of their sides.

Such blocks form for example modules MDL20 and MDL21 which are respectively PMOS and NMOS transistors. Other blocks are in mutual capacitive coupling by way of a part of the isolating region RIS. Of course, the distance d between capacitive blocks in mutual coupling will condition the capacitive value of the coupling. The lower the distance the higher the capacitive value will be and the higher the distance the lower the capacitive value will be.

The person skilled in the art will know how to choose the distance separating two blocks in capacitive coupling as a function of the desired coupling. By way of example, when the isolating region is a field oxide, for example, of the type of that used in shallow isolation trenches (STI), a distance of between 0 and 500 nanometers, for example 55 nanometers, will be chosen.

It is also noted in the device DIS that the block EC forms a control electrode for the two transistors MDL20 and MDL21. The whole assembly then forms a module MDL2 which is in fact an inverter.

The inverter MDL2 here forms an output stage for the device PIS and, the latter also comprises other blocks situated upstream of this output stage 1. These other blocks form another module MDL1 which is, for example, a logic circuit. Therefore, the device here comprises a processing stage followed by an output stage. The device also comprises two input blocks BLCPA and BLCPB intended to receive two input voltages Va and Vb. It also comprises two output blocks BLCPS and BLCPNS mutually linked by a metallization MTL and intended to deliver an output voltage Vs.

Other blocks are linked to the supply voltage Vdd by way of one metallization MTL and other blocks are grounded GND by way of other metallizations MTL. These metallizations comprise, for example, metallic tracks and vias of the type of those present in the back end of line (BEOL) part of an integrated circuit.

As a variant it would be possible to replace at least one of these metallizations by at least one electrically conducting trench extending in the isolating region RIS in a coplanar or non-coplanar manner with the various blocks. The trench or trenches may be, for example, filled with a metal.

Figure 3:
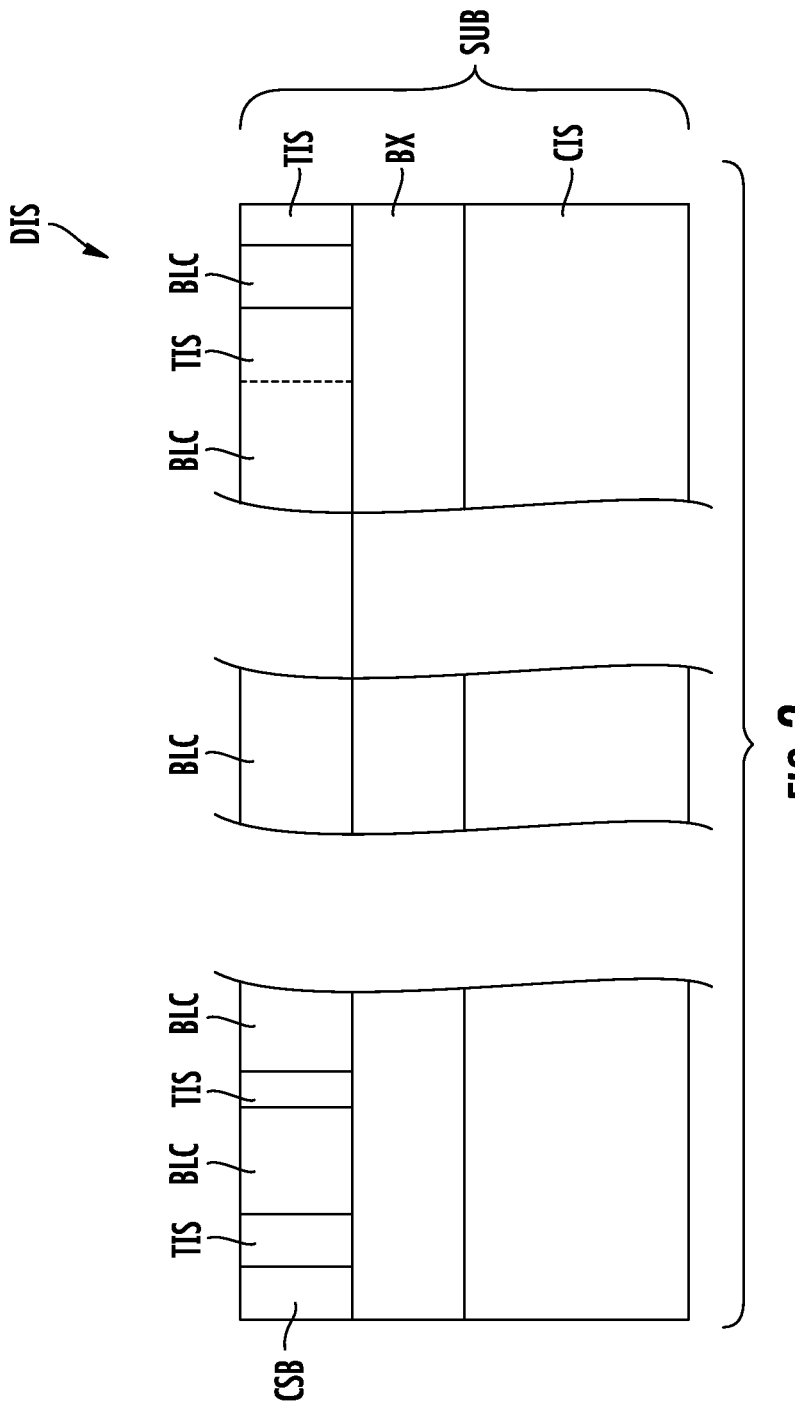
FIG. 3 is a schematic side elevational view of the electronic device of FIG. 2.

Although the region RIS may be produced within a substrate SUB of bulk type, it may be particularly advantageous, as illustrated in FIG. 3, to use a substrate SUB of the SOI type comprising a lower substrate layer CIS below a buried oxide layer BX below an upper substrate layer CSB.

The device DIS is then, for example, as illustrated in FIG. 3, produced within the upper substrate layer CSB. Consequently, here, all the blocks BLC of all the modules are produced in one and the same plane, that is to say at one and the same level. Their upper faces are coplanar, as are their lower faces. There is therefore an essentially two-dimensional structure for the device DIS.

The blocks BLC are isolated at the bottom by way of the buried oxide BX and for those which are in capacitive coupling, isolated by isolating trenches TIS, for example, shallow isolation trenches STI optionally of different depths. These trenches are conventionally filled with a field oxide, for example, silicon dioxide. These trenches and their filling are produced in a conventional manner known in the field of integrated circuit fabrication.

Figure 4:
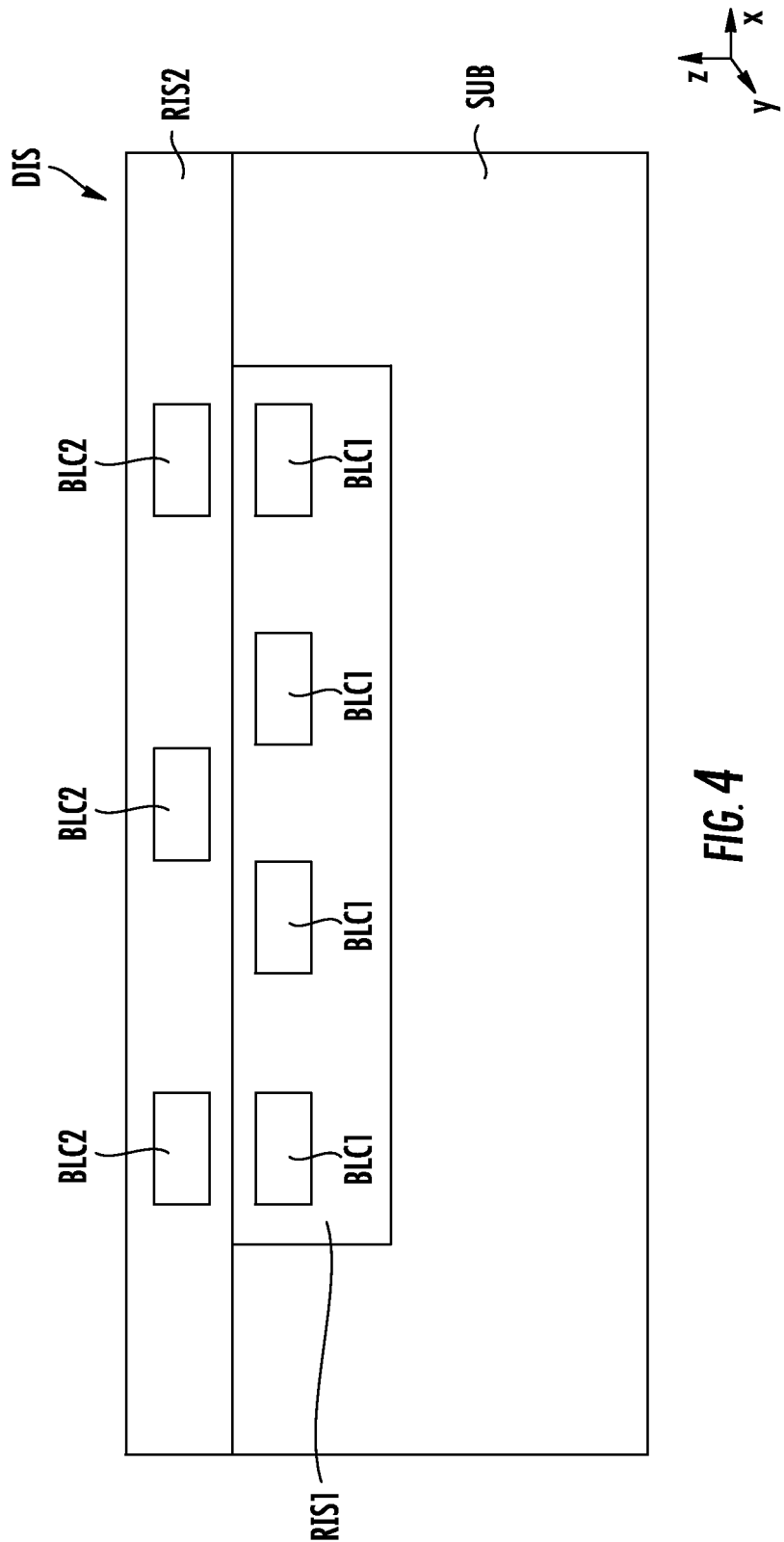
FIG. 4 is a schematic side elevational view of another embodiment of the electronic device according to the invention.

As a variant, as illustrated in FIG. 4, it would be possible to produce the device DIS on several levels so as to obtain a three-dimensional structure. More precisely, in the example illustrated in FIG. 4, a first isolating region RIS1 is produced within a substrate SUB, for example of bulk type, and comprises blocks BLC1 forming one or more modules and extending in a plane XY, within one and the same first level.

Another isolating region RIS2 is deposited above the region RIS1 and incorporates blocks BLC2 forming one or more other modules of the device DIS.

Here again, the blocks BLC2 extend in another plane XY parallel to the module BLC1 but at a higher level. Of course, it would also be possible that a module MDL of the device DIS can be formed by a block BLC1 situated in the isolating region RIS1 and by one or more blocks BLC2 situated in the region RIS2. Thus, a module of the device DIS can extend in a plane YZ.

For the sake of simplification of FIG. 4, the optional electrical connections between the various blocks are not represented in this figure.

Reference is now made to FIGS. 5A-16 to illustrate examples of electronic modules formed with the aid of semiconductor blocks some of which are in mutual capacitive coupling and others of which are in mutual contact.

Figure 5B:
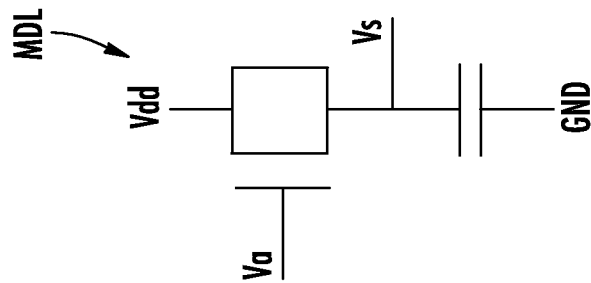
FIG. 5B is a schematic circuit diagram of the memory cell of FIG. 5A.
Figure 5A:
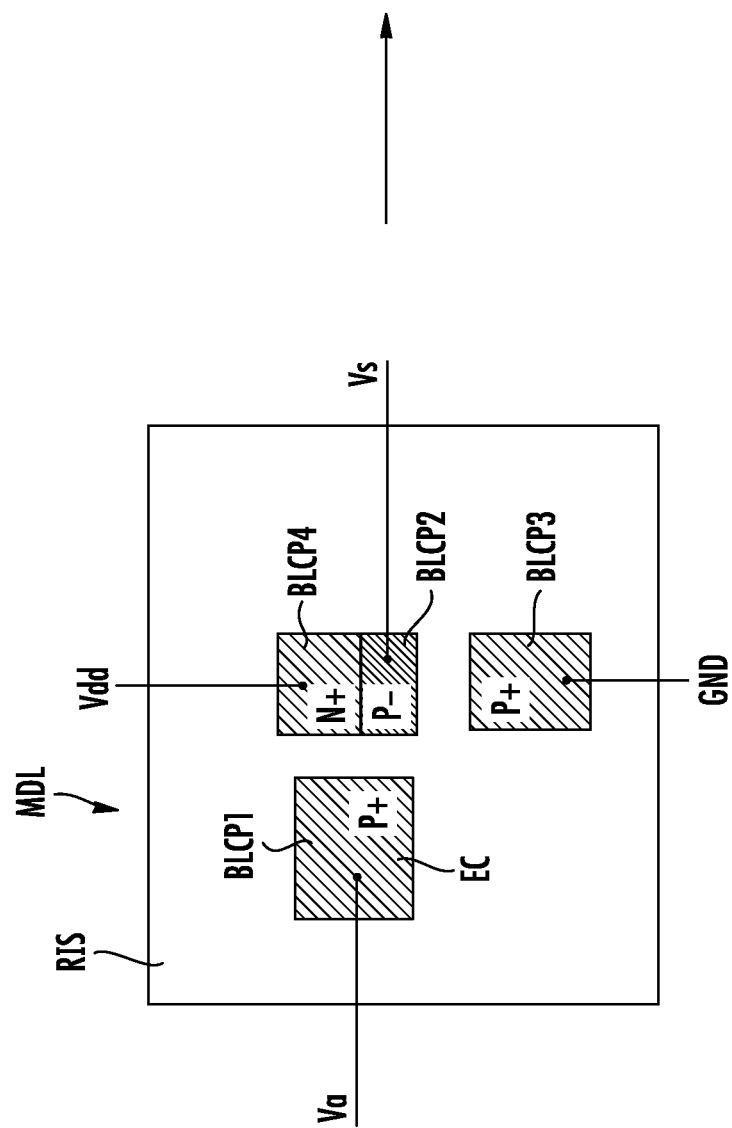
FIG. 5A is a schematic plan view of a memory cell according to the invention.

In FIGS. 5A and 5B, the blocks BLCP1-BLCP3 and BLCN form a module MDL producing a memory point or cell. More precisely, the block BLCN, of conductivity type N, is doped (with a dopant concentration equal, for example, to $10^{20}$ atoms/cm$^3$), and is in contact with a block BLCP2 of conductivity type P and being P+ doped (dopant concentration equal to $10^{20}$ atoms/cm$^3$). These two blocks BLCN and BLCP2 form a PN junction. The block BLCP1 is distant from the blocks BLCN and BLCP2 and is capacitively coupled with these blocks and forms a control electrode for the PN junction or diode.

The block BLCP1 is also of conductivity type P with a P+ doping. That said, it would be possible to use a block of any other type of conductivity and/or of doping, for example, a doping of type "P intrinsic" (Pint), exhibiting a lower doping P than the doping P+, for example $10^{14}$ atoms/cm$^3$.

The block BLCP3 of conductivity type P with a P+ doping is distant from the block BLCP2 and is capacitively coupled with the latter so as to form a capacitor as illustrated in FIG. 5B.

The block BLCN is intended to receive the supply voltage Vdd while the block BLC3 is intended to be grounded GND. The block BLCP1, forming the control electrode, is intended to receive a control voltage Va while the block BLC2 is intended to form the output node of the memory cell and to deliver an output voltage Vs.

When the control voltage Va is zero, or lower than the threshold voltage of the diode, the voltage Vs is zero since the diode is disabled and the capacitor is grounded.

On the other hand, when the control voltage Va becomes greater than the threshold voltage of the PN junction, the capacitive coupling then brings about the creation of an inversion channel of the junction, the effect of which is to cause the voltage Vs to rise to a value Vdd1 lower than the value Vdd and charging the capacitor. And, this voltage will thereafter decrease by recombination of the carriers in the PN junction until it regains the zero value. A memory cell has therefore indeed been produced.

Figure 6B:
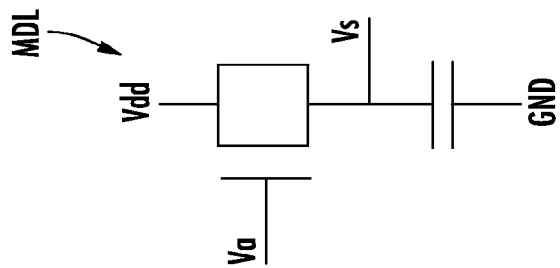
FIG. 6B is a schematic circuit diagram of the memory cell of FIG. 6A.
Figure 6A:
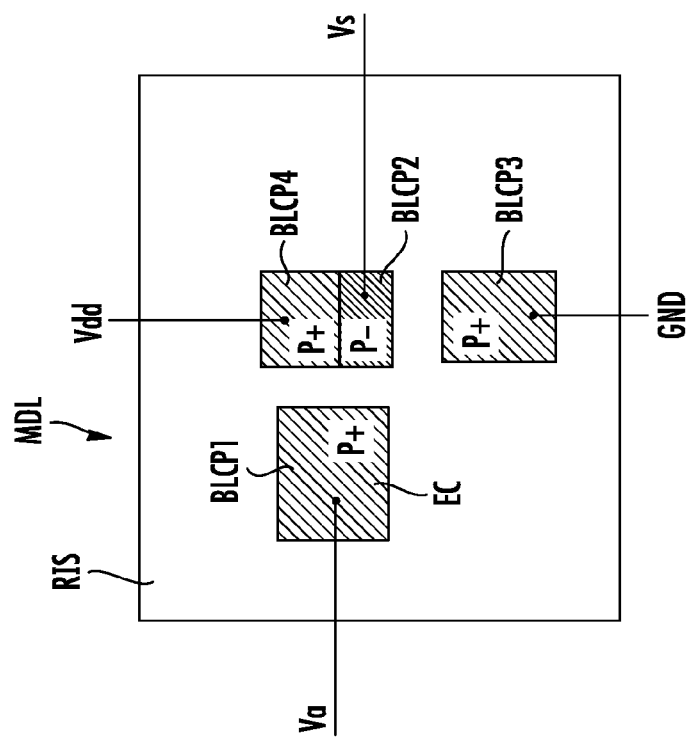
FIG. 6A is a schematic plan view of another memory cell according to the invention.

It is also possible to produce a memory cell by using the module illustrated in FIGS. 6A and 6B. With respect to the module illustrated in FIGS. 5A and 5B, that illustrated in FIGS. 6A and 6B is distinguished by the fact that the block BLCN of the PN junction of the module of FIGS. 5A and 5B is replaced here with a block BLCP4 of conductivity type P and P+ doped (for example, $10^{20}$ atoms/cm$^3$).

Moreover, the block BLCP2 is a block of type "P intrinsic" (Pint), exhibiting a lower P doping than the P+ doping, for example, $10^{14}$ atoms/cm$^3$. The other blocks are similar to those which were described with reference to FIGS. 5A and 5B.

It is therefore seen that the blocks BLCP4 and BLCP2 form a resistor of variable resistive value, with the control electrode EC (block BLCP1) making it possible to control the resistive value of this resistor. More precisely, the module BLCP2 ($P_{int}$) exhibits a quasi-infinite resistance while the block BLCP4 (P+doped) exhibits a lower resistive value.

Moreover, the capacitive coupling between the block BLCP1 and the blocks BLCP4 and BLCP2 is likened to a MOS effect. Therefore, when the voltage Va is zero, the resistive value between the node Vdd and the output node Vs is quasi-infinite on account of the presence of the block BLCP2 having the intrinsic P doping. On the other hand, when the voltage Va is greater than the threshold voltage of the "MOS transistor", an inversion channel is then created along the variable resistance which results in a charge carrier intake. Consequently, the doping of the block BLCP2 increases and the resistance decreases. Therefore, the voltage Vs increases to attain a voltage Vdd2 lower than the voltage Vdd.

When the voltage Va drops back to zero, there is again a recombination of carriers between the blocks BLCP2 and BLCP4 causing the output voltage Vs to drop back to zero.

Here again therefore a memory cell has been created, with the aid of a resistor of controllable variable resistive value. That said, such a structure may exhibit less leakage than that illustrated in FIGS. 5A and 5B.

Here, the control electrode BLCP1 was P+ doped. That said, it would be possible to take a block BLCP1 N+ doped or else having a doping of the intrinsic P type that is to say a lower doping than the P+ doping. The choice of the type of conductivity and of the concentration of dopants makes it possible to condition the threshold voltage of the module.

More precisely, the threshold voltage $V_T$ of the structure BLCP1, BLCP2, BLCP4 is given by the following formula:

$$V_T = 2\phi_{Fi} + \frac{(4qN_A^{Pint}\varepsilon_{ox}\phi_{Fi})^{1/2}}{Cox} + V_{FBMS} + V_{FBQox}$$

with $$\phi_{Fi} = \frac{KT}{q}\text{Ln}\left(\frac{N_A^{Pint}}{n_i}\right)$$

$$V_{FBMS} = \frac{KT}{q}\text{Ln}\left(\frac{N_A^{P+}}{N_A^{Pint}}\right)$$

$$VFBQox = \frac{Qox}{Cox}$$

$$Cox = \varepsilon_{ox}\frac{Sox}{Tox}$$

where
K is Boltzmann's constant,
T the temperature,
q the charge on the electron,
$N_A^{Pint}$ the concentration of dopants of the block BLCP2,
$N_A^{P+}$ the concentration of dopants of the block BLCP4,
$n_1$ the intrinsic concentration of charge carriers in the semiconductor material,
$\varepsilon_{ox}$ the dielectric constant of the oxide Ox,
$S_{ox}$ the surface area of the oxide Ox,
$T_{ox}$ the thickness of the oxide Ox,
$Q_{ox}$ the quantity of charge trapped in the oxide, obtained by measurement.

Figure 7B:
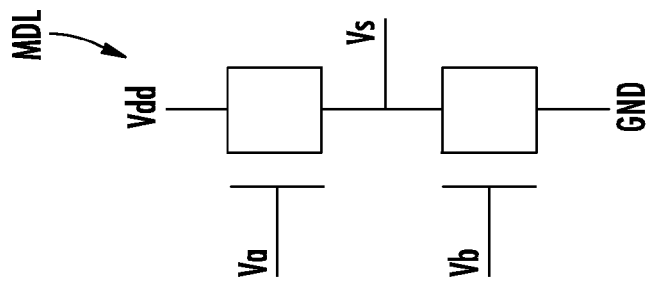
FIG. 7B is a schematic circuit diagram of the memory cell of FIG. 7A.
Figure 7A:
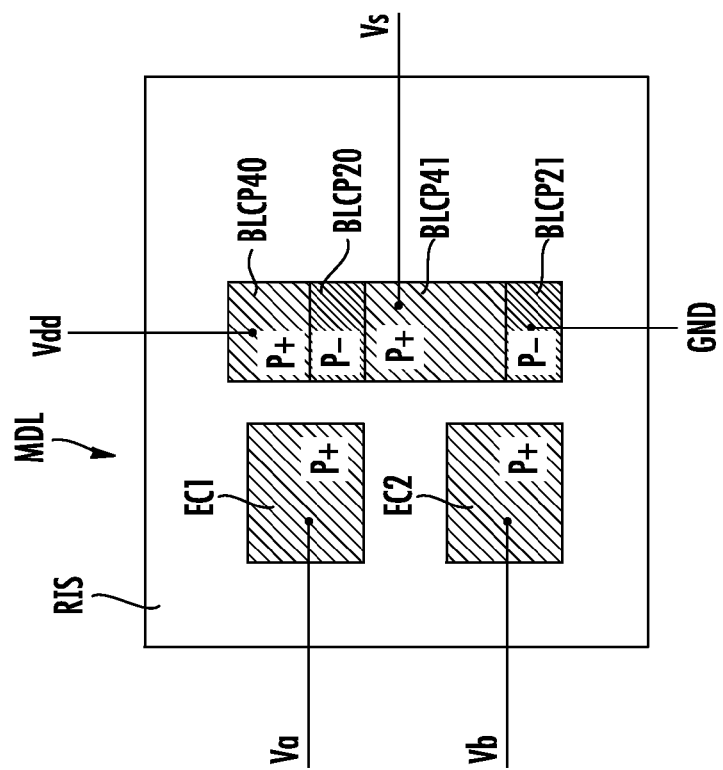
FIG. 7A is a schematic plan view of yet another memory cell according to the invention.
Figure 8D:
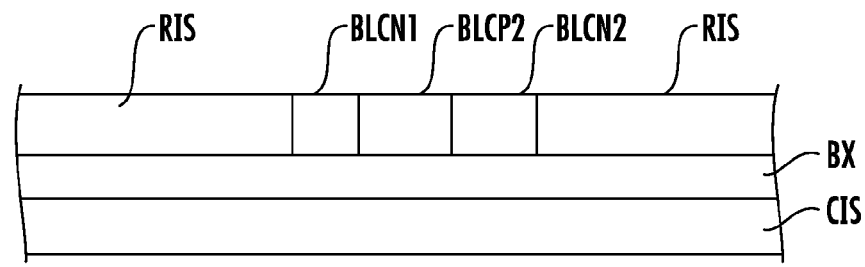
FIG. 8D is a schematic cross-section view of the NMOS transistor of FIG. 8A along line 8D-8D.
Figure 8E:
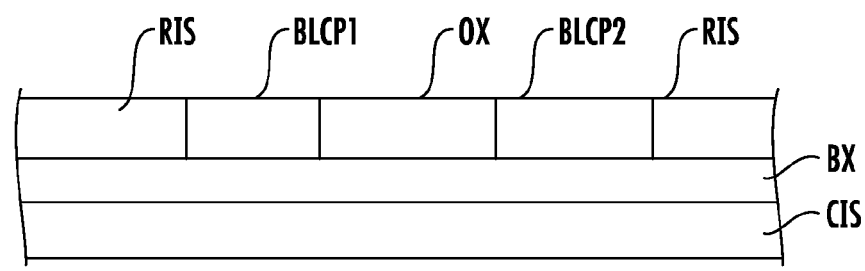
FIG. 8E is a schematic cross-section view of the NMOS transistor of FIG. 8A along line 8E-8E.

The module MDL illustrated in FIGS. 7A and 7B forms a memory cell which may be reinitialized with the aid of a reinitialization signal Vb ("Reset"). With respect to the structure illustrated in FIGS. 6A and 6B, the module MDL comprises an additional controlled resistive value resistor.

More precisely, the block BLCP40 (P+ doped) and the block BLCP20 (intrinsic P doped) together with the control electrode EC1 form a first resistor of resistive value controllable by the voltage Va ("Set"). Moreover, the blocks BLCP41 and BLCP21 are respectively analogous to the blocks BLCP40 and BLCP20. They form with the second control electrode EC2 a second resistor of resistive value controllable by the voltage Vb ("Reset").

The two blocks BLCP20 and BLCP41 are in mutual contact by one of their sides and the output node Vs is taken on the block BLCP20.

When the voltage Va becomes greater than the threshold voltage, the voltage Vs rises until it attains a value Vdd2 that is lower than the voltage Vdd. And, if it is desired to reinitialize the memory cell, a voltage Vb greater than the threshold voltage is then applied, the effect of which is then to cause the voltage Vs to drop back much more rapidly to ground.

FIGS. 8A-8E represents a module MDL forming an NMOS transistor. More precisely, it is seen that the module MDL comprises (FIG. 8A) two modules BLCN1 and BLCN2, of conductivity type N and N+doped ($10^{20}$ atoms/$cm^3$, for example) contacting the two opposite sides of a module BLCP2, P doped (intrinsic P doping: $10^{14}$ atoms/$cm^3$, for example).

Moreover, a block BLCP1 P+ doped, is in capacitive coupling with the previously mentioned blocks, and in particular with the block BLCP2. The block BLCP1 forms the gate of the transistor, the blocks BLCN1 and BLCN2 form the two conduction electrodes of the transistor (drain and source), it being understood, of course, that the drain and source of the transistor are interchangeable with regard to the symmetry of the structure. Finally, the block BLCP2 forms the channel of the transistor.

The part OX of the isolating region situated between the block BLCP1 and the blocks BLCN1, BLCP2 and BLCN2 forms the gate oxide of the transistor.

It should be noted, as illustrated in the FIG. 8C, that the blocks are not necessarily rectangular but can exhibit any appropriate shape. Thus, the exemplary topology (layout) of the transistor illustrated in FIG. 8C shows a J-shaped block BLCP1 and the three blocks BLCN1, BLCN2 and BLCP2 forming a C. The zones Z1, Z2 and ZG illustrate the contact tap zones on these drain, source and gate semiconductor regions.

It will be noted that the transistor thus produced comprises blocks situated in one and the same plane (on one and the same level), the gate of the transistor not being above the channel region, but at the same level as this channel region and laterally disposed therefrom. The thickness of the region OX makes it possible to modulate the threshold voltage of the transistor.

Measurements of drain/source current Ids as a function of the voltage Vgs and of the voltage Vds have been performed on the device of FIGS. 8A-8C with a gate oxide OX having a thickness of 55 nanometers and formed of field oxide.

Figure 10:
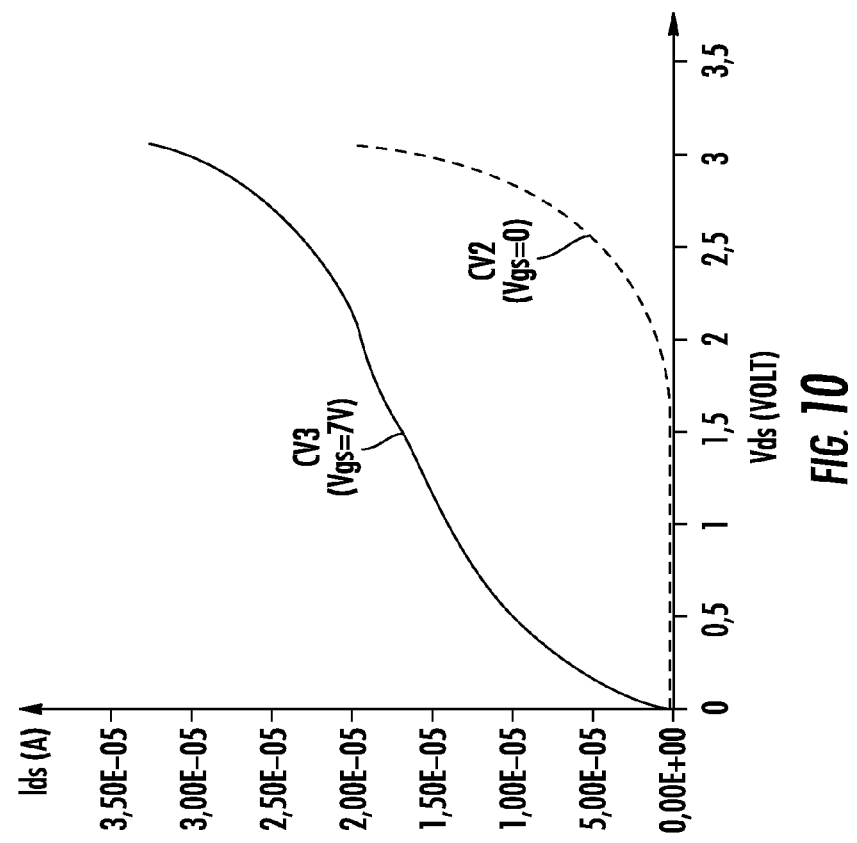
FIG. 10 is another graph of drain source currents for the NMOS transistor of FIGS. 8A-8C.
Figure 9:
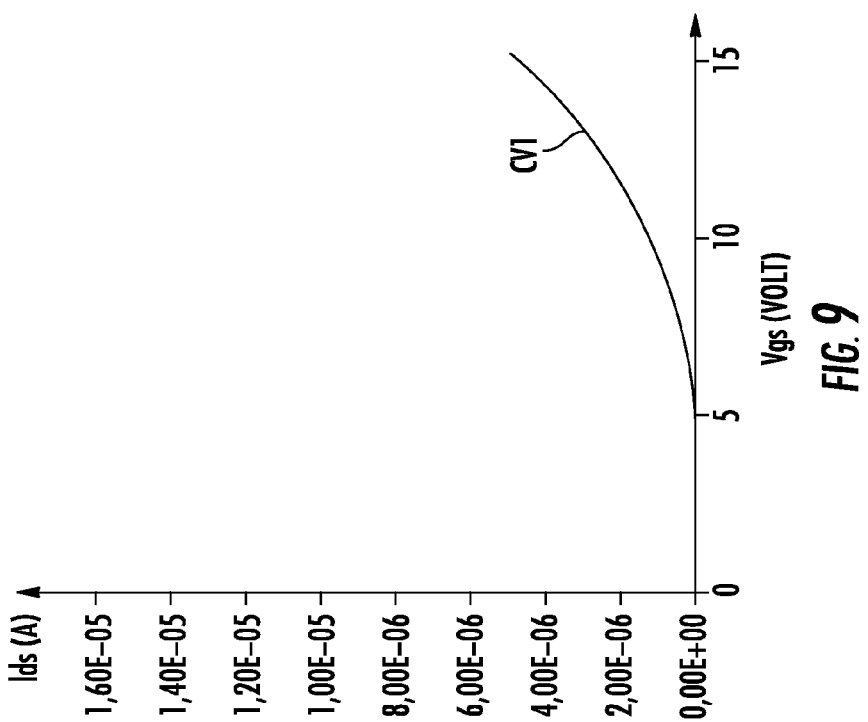
FIG. 9 is a graph of drain source current for the NMOS transistor of FIGS. 8A-8C.

The change of the current Ids as a function of the voltage Vgs (curve CV1) shows that such a transistor exhibits a high threshold voltage equal to 5 volts (FIG. 9). Moreover, FIG. 10 shows the change of the current Ids as a function of the voltage Vds for a zero voltage Vgs (curve CV2: disabled mode) and for a voltage Vgs equal to 7 volts (curve CV3). The curves characteristic of an NMOS transistor are indeed obtained.

FIGS. 11A-11B illustrate blocks forming a module MDL forming a PMOS transistor. It is assumed in this example that the module MDL is produced in a substrate of fully depleted SOI type (FDSOI: Fully Depleted SOI) that is to say exhibiting an extremely thin upper layer.

For this reason and to avoid overly large leakage, the PMOS transistor comprises for the channel region, a block BLCP3 P doped with a doping of intrinsic P type (for example $10^{14}$ atoms/$cm^3$). The module MDL also comprises on either side of this module BLCP3, and in contact with the latter, two blocks BLCP2 and BLCP4 P+ doped (typically $10^{20}$ atoms/$cm^3$) and forming the drain and source regions, it being understood, of course, that here again the drain and source regions are interchangeable.

Moreover, in FIG. 11A, another block BLCP1, for example P+doped (though it is also possible to use an N+doped block), is capacitively coupled with the block BLCP3 so as to form the control electrode (gate) of the transistor. Here again, as in FIGS. 8A-8C, the gate oxide OX of the transistor is formed by a part of the isolating region RIS. And, here again, the PMOS transistor is a coplanar transistor.

The PMOS transistor of FIGS. 11A and 11B is noteworthy in the sense that it is not formed by two PN junctions, but by two controllable resistive value resistors of the type of those which were described hereinabove. More precisely, a first resistor is formed by the blocks BLCP2 and BLCP3 while a second resistor is formed by the block and the block BLCP3 and the block BLCP4.

If the gate voltage Va is zero, then the channel region exhibits an infinite resistance while in the presence of a voltage Va greater than the threshold voltage, there is accumulation of carriers in the channel zone and the doping of the latter passes from a doping of the intrinsic P type to a doping of the P+ type.

Figure 13:
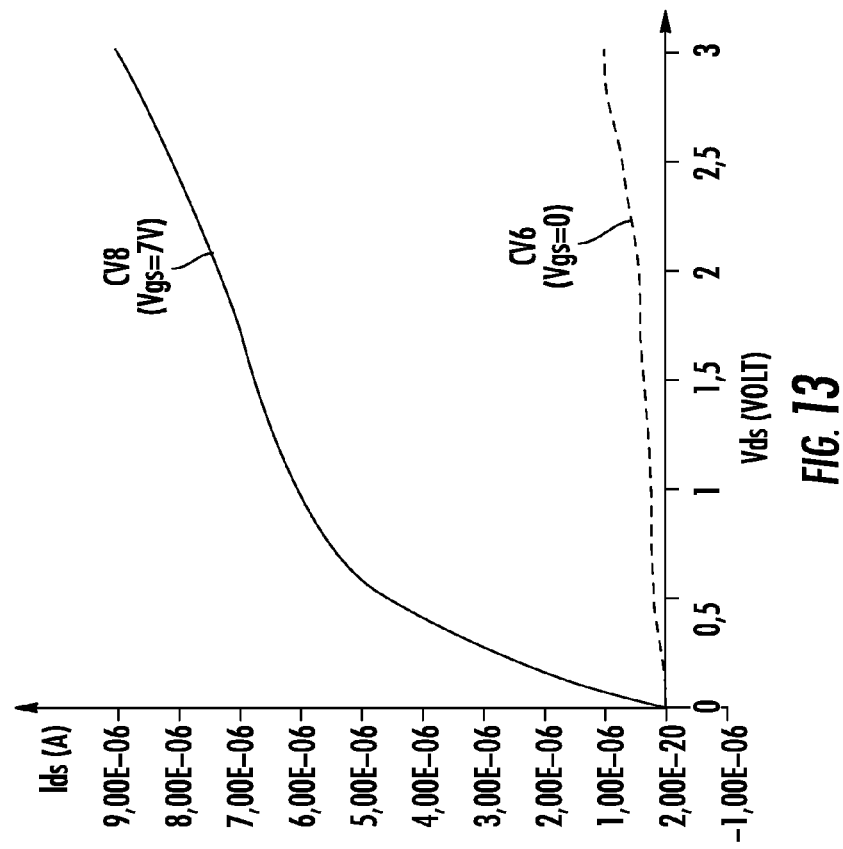
FIG. 13 is another graph of drain source currents for the PMOS transistor of FIGS. 11A-11B.
Figure 12:
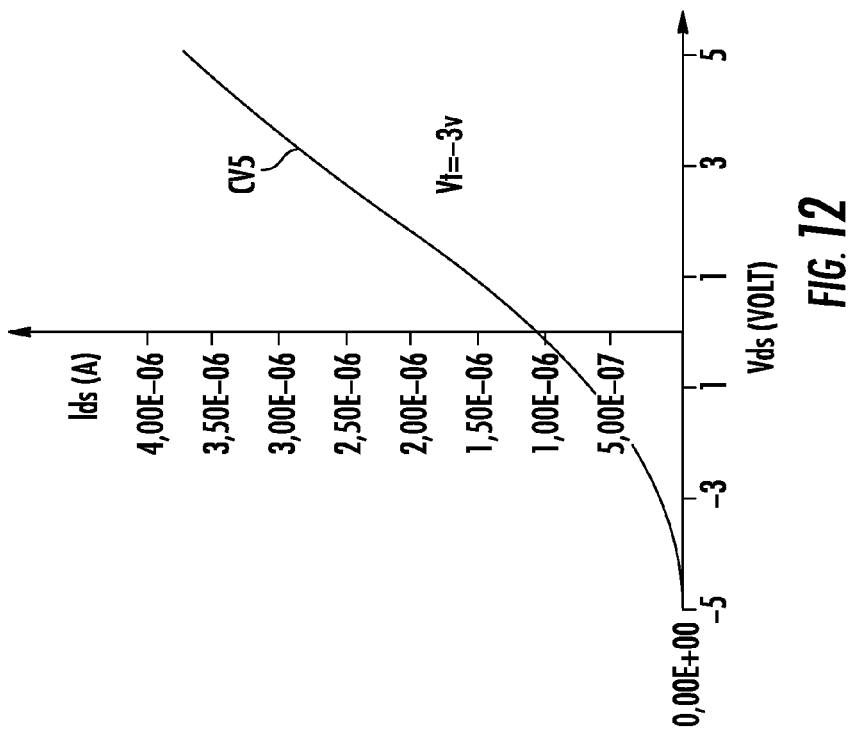
FIG. 12 is a graph of drain source current for the PMOS transistor of FIGS. 11A-11B.

The topology of this transistor is, for example, identical to that which was illustrated in FIG. 8C for the NMOS transistor. Measurements performed on this transistor are illustrated in FIGS. 12 and 13. FIG. 12 illustrates the change (curve CV5) of the current Ids as a function of the voltage Vgs and shows for such a transistor a threshold voltage equal to −3 volts. FIG. 13 illustrates the change of the drain/source current Ids as a function of the drain/source voltage Vds for a zero voltage Vgs (curve CV6) and for a voltage Vgs equal to 7 volts (curve CV8).

Figure 14B:
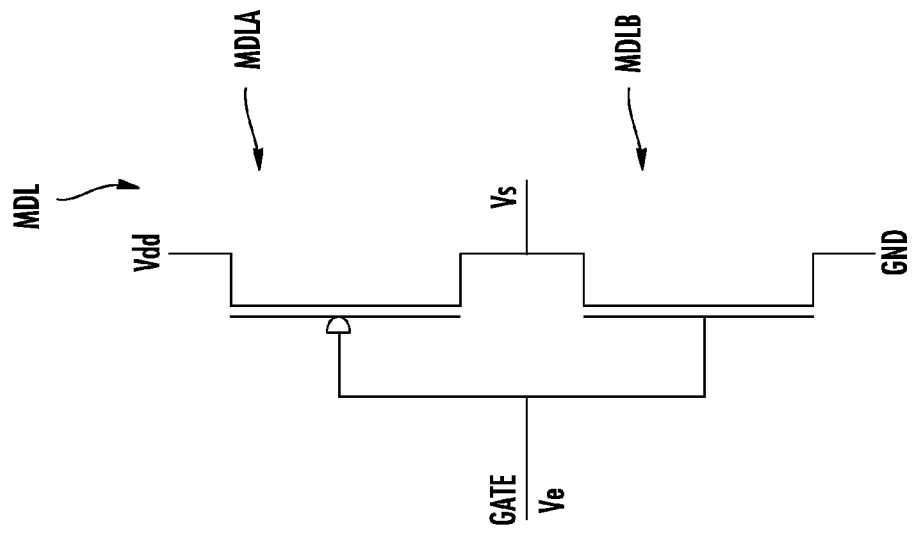
FIG. 14B is a schematic circuit diagram of the pair of transistors of FIG. 14A.
Figure 14A:
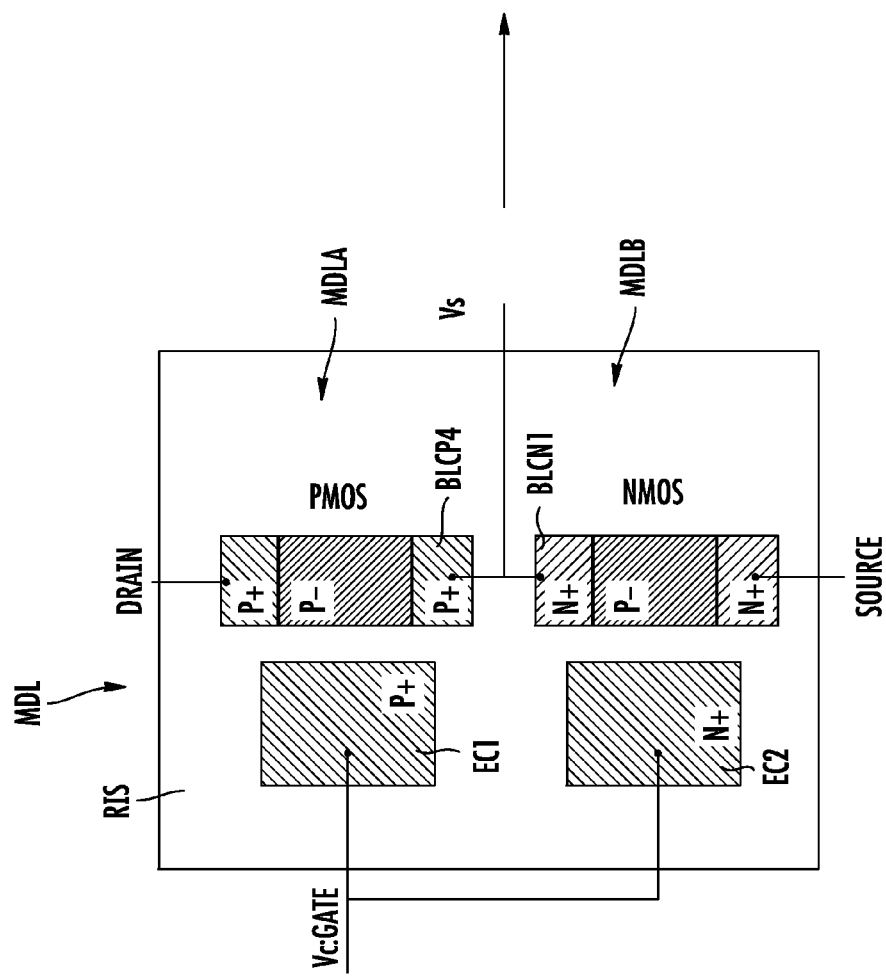
FIG. 14A is a schematic plan view of a pair of transistors according to the invention.

In FIGS. 14A and 14B, the module MDL comprises two modules MDLA and MDLB forming, respectively, a PMOS transistor and an NMOS transistor. The two modules MDLA and MDLB are respectively analogous to those which were described with reference to FIGS. 11A and 11B and 8A-8C. The two blocks BLCP4 and BLCN1 of the modules MDLA and MDLB are linked together, for example, by a metallization, to form the output node delivering the voltage Vs. Moreover, the two control electrodes EC1 and EC2 are linked also by a metallization and are intended to receive the gate voltage Ve.

The module MDL therefore forms a coplanar inverter based on complementary transistors. In the example described here this inverter is also assumed to be produced in a substrate of the SOI type, in particular, of the fully depleted type since the PMOS transistor (MDLA) comprises resistors of variable resistive values.

Figure 15:
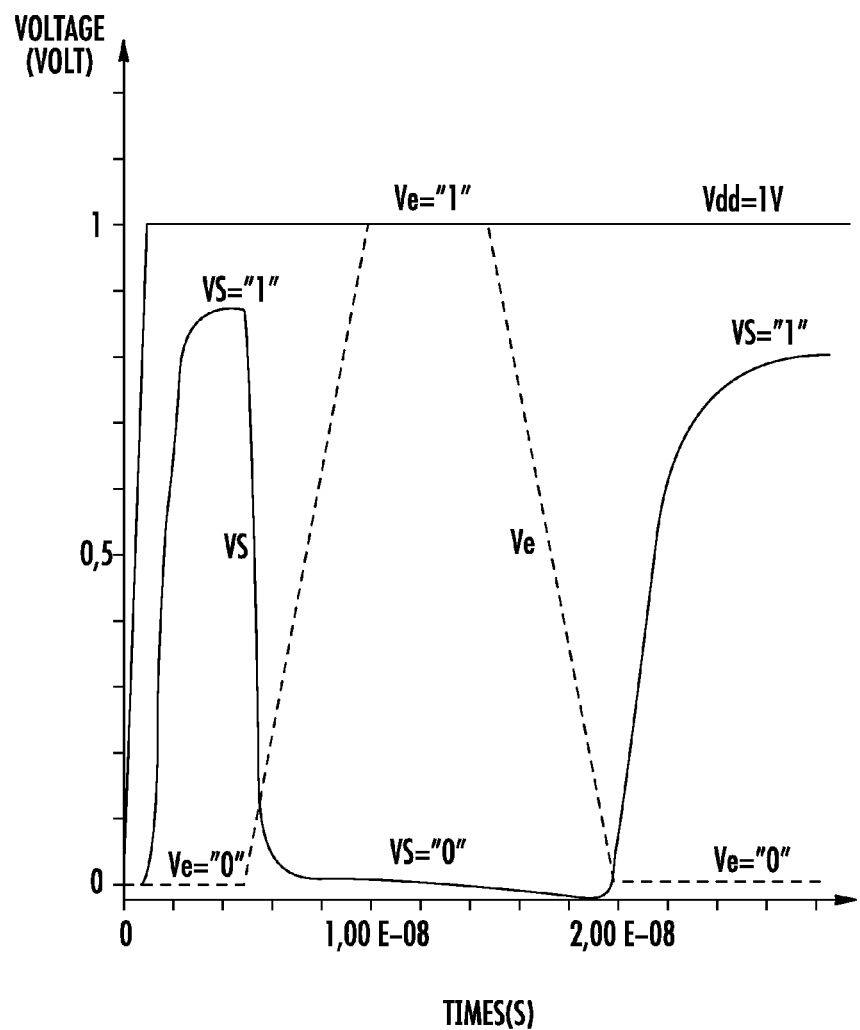
FIG. 15 is a graph of operation of the pair of transistors of FIGS. 14A-14B.

FIG. 15 illustrates the change of the various voltages across the terminals of the inverter. It is therefore seen that when the voltage Vdd is equal to 1 volt and the input voltage Ve is zero, the output voltage Vs is equal to 1. Next, when the input voltage Ve rises to 1, the output voltage Vs descends to 0 and then rises back to 1 when the input voltage Ve drops back to 0. The characteristic behavior of an inverter is therefore indeed obtained.

In FIGS. 16A and 16B, the module MDL exhibits a block structure identical to that illustrated in FIGS. 5A and 5B or to that illustrated in FIGS. 6A and 6B. On the other hand, whereas the control electrode EC receives the signal Va, the block BLCN or BLCP4 receives another voltage Vb, and the block BLCP3 delivers the output voltage Vs. The module MDL then carries out an AND logic function between the input signals Va and Vb.

Indeed, if the voltage Va is zero, the output is zero whatever the value of Vb. If the voltage Vb is zero, the output Vs is zero whatever the value of Va. And, if both the voltages Va and Vb have the logic value "1" (application of Vdd to both inputs), then the voltage Vs passes to "1" through the creation of inversion channel along the diode or the variable resistor.

Although described hereinabove is the possibility of producing a memory cell, for example, by replacing the diode of a memory cell by a MOS transistor of P or N type.

By way of example the MOS transistor of FIGS. 8A and 8B can be supplemented with another block in capacitive coupling with the block BLCN2 of the transistor, so as to produce the capacitor of the memory cell, and link this other block to ground in a manner analogous to the memory cell of FIGS. 5A and 5B.

That which is claimed is:

1. An electronic device comprising:
   a substrate; and
   a plurality of transistors in said substrate, each transistor comprising
       an isolating region,
       a drain block,
       a source block,
       a channel block between said drain and source blocks, and
       a gate block being laterally spaced apart from and laterally outside of said drain, channel, and source blocks and being capacitively coupled by a part of the isolating region to said drain, channel, and source blocks,
       said gate, drain, channel, and source blocks each having coplanar lowermost planar surfaces and coplanar uppermost planar surfaces,
       at least two of the drain, channel, and source blocks having different semiconductor properties and being in mutual contact by one of their sides, the different semiconductor properties comprising at least one of different conductivity types or different dopant concentrations.

2. The electronic device according to claim 1, wherein the gate, drain, and source blocks comprise respective electrical contact tap zones.

3. The electronic device according to claim 1, wherein at least some of the blocks comprise a monocrystalline semiconductor structure.

4. The electronic device according to claim 1, wherein at least some of the blocks comprise a polycrystalline semiconductor structure.

5. The electronic device according to claim 1, wherein at least one part the isolating region comprises a field oxide filled trench.

6. An electronic device comprising:
   a substrate; and
   a plurality of logic circuits in said substrate, each logic circuit comprising
       an isolating region,
       a first resistor block,
       a second resistor block, and
       a control block being laterally spaced apart from and laterally outside of said first and second resistor blocks and being capacitively coupled by a part of the isolating region to said first and second resistor blocks,
       said control, and first and second resistor blocks each having coplanar lowermost planar surfaces and coplanar uppermost planar surfaces,
       at least two of the control, and first and second resistor blocks having different semiconductor properties and being in mutual contact by one of their sides, the different semiconductor properties comprising at least one of different conductivity types or different dopant concentrations.

7. The electronic device according to claim 6, wherein at least some of the blocks comprise a monocrystalline semiconductor structure.

8. The electronic device according to claim 6, wherein at least some of the blocks comprise a polycrystalline semiconductor structure.

9. The electronic device according to claim 6, wherein at least one part the isolating region comprises a field oxide filled trench.

10. An electronic device comprising:
    a substrate; and
    a plurality of inverters in said substrate, each inverter comprising
        an isolating region,
        a drain block,
        a source block,
        a channel block between said drain and source blocks, and
        a gate block being laterally spaced apart from and laterally outside of said drain, channel, and source blocks and being capacitively coupled by a part of the isolating region to said drain, channel, and source blocks,
        said gate, drain, channel, and source blocks each having coplanar lowermost planar surfaces and coplanar uppermost planar surfaces,
        at least two of the drain, channel, and source blocks having different semiconductor properties and being in mutual contact by one of their sides, the different semiconductor properties comprising at least one of different conductivity types or different dopant concentrations.

11. The electronic device according to claim 10, wherein at least some of the blocks comprise a monocrystalline semiconductor structure.

12. The electronic device according to claim 10, wherein at least some of the blocks comprise a polycrystalline semiconductor structure.

13. The electronic device according to claim 10, wherein at least one part the isolating region comprises a field oxide filled trench.

* * * * *